(12) United States Patent
Odnoblyudov et al.

(10) Patent No.: US 11,271,101 B2
(45) Date of Patent: *Mar. 8, 2022

(54) RF DEVICE INTEGRATED ON AN ENGINEERED SUBSTRATE

(71) Applicant: QROMIS, Inc., Santa Clara, CA (US)

(72) Inventors: Vladimir Odnoblyudov, Danville, CA (US); Cem Basceri, Los Gatos, CA (US); Ozgur Aktas, Santa Clara, CA (US)

(73) Assignee: QROMIS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/812,120

(22) Filed: Mar. 6, 2020

(65) Prior Publication Data

US 2020/0212214 A1 Jul. 2, 2020

Related U.S. Application Data

(63) Continuation of application No. 15/891,205, filed on Feb. 7, 2018, now Pat. No. 10,622,468.

(Continued)

(51) Int. Cl.
*H01L 29/778* (2006.01)
*H01L 21/02* (2006.01)
(Continued)

(52) U.S. Cl.
CPC ...... *H01L 29/7787* (2013.01); *H01L 21/0245* (2013.01); *H01L 21/0254* (2013.01);
(Continued)

(58) Field of Classification Search
CPC ............ H01L 29/7787; H01L 29/7786; H01L 29/41766; H01L 29/66462;
(Continued)

(56) References Cited

U.S. PATENT DOCUMENTS 4,930,044 A * 5/1990 Eda .......................... H01G 4/10
257/E27.116
8,697,541 B1 4/2014 Kumar
(Continued)

FOREIGN PATENT DOCUMENTS

| WO | 2017/218536 A1 | 12/2017 |
| WO | 2018/039316 A1 | 3/2018 |
| WO | 2018125723 A1 | 7/2018 |

OTHER PUBLICATIONS

EP18758343.0, "Extended European Search Report", Dec. 9, 2020, 7 pages.
(Continued)

*Primary Examiner* — Ahmed N Sefer
(74) *Attorney, Agent, or Firm* — Kilpatrick Townsend & Stockton LLP

(57) ABSTRACT

A substrate for RF devices includes a polycrystalline ceramic core and an interlayer structure. The interlayer structure includes a first silicon oxide layer coupled to the polycrystalline ceramic core, a polysilicon layer coupled to the first silicon oxide layer, a second silicon oxide layer coupled to the polysilicon layer, a barrier layer coupled to the second silicon oxide layer, a third silicon oxide layer coupled to the barrier layer, and a substantially single crystalline silicon layer coupled to the third silicon oxide layer.

19 Claims, 10 Drawing Sheets

Related U.S. Application Data

(60) Provisional application No. 62/461,722, filed on Feb. 21, 2017.

(51) Int. Cl.

| | |
|---|---|
| *H01L 23/373* | (2006.01) |
| *H01L 23/66* | (2006.01) |
| *H01L 29/40* | (2006.01) |
| *H01L 21/762* | (2006.01) |
| *H01L 29/417* | (2006.01) |
| *H01L 29/66* | (2006.01) |
| *H01L 23/48* | (2006.01) |
| *H01L 29/12* | (2006.01) |

(52) U.S. Cl.
CPC .. *H01L 21/02389* (2013.01); *H01L 21/02488* (2013.01); *H01L 21/02491* (2013.01); *H01L 21/02505* (2013.01); *H01L 21/76251* (2013.01); *H01L 23/3735* (2013.01); *H01L 23/66* (2013.01); *H01L 29/404* (2013.01); *H01L 29/41766* (2013.01); *H01L 29/66462* (2013.01); *H01L 29/7786* (2013.01); *H01L 23/481* (2013.01); *H01L 29/122* (2013.01); *H01L 2223/6616* (2013.01); *H01L 2223/6627* (2013.01)

(58) Field of Classification Search
CPC ......... H01L 21/02491; H01L 21/02389; H01L 21/02505; H01L 21/02488; H01L 21/0245; H01L 21/0254; H01L 23/3735; H01L 23/66; H01L 29/404; H01L 21/76251; H01L 29/122; H01L 2223/6616; H01L 23/481; H01L 2223/6627; H01L 29/2003
See application file for complete search history.

(56) References Cited

U.S. PATENT DOCUMENTS

| | | | |
|---|---|---|---|
| 9,023,688 B1 | 5/2015 | Or-Bach et al. | |
| 10,290,674 B2 | 5/2019 | Odnoblyudov et al. | |
| 10,297,445 B2* | 5/2019 | Odnoblyudov | ..... H01L 21/0242 |
| 10,438,792 B2 | 10/2019 | Odnoblyudov et al. | |
| 10,510,582 B2* | 12/2019 | Odnoblyudov | ..... H01L 29/0649 |
| 10,622,468 B2 | 4/2020 | Odnoblyudov et al. | |
| 10,763,109 B2 | 9/2020 | Odnoblyudov et al. | |
| 10,910,258 B2* | 2/2021 | Odnoblyudov | ........ H01L 21/481 |
| 2006/0076559 A1* | 4/2006 | Faure | ..................... C30B 33/00 |
| | | | 257/49 |
| 2006/0255341 A1 | 11/2006 | Pinnington et al. | |
| 2006/0284247 A1 | 12/2006 | Augustine et al. | |
| 2007/0045672 A1 | 3/2007 | Nishi et al. | |
| 2008/0308897 A1* | 12/2008 | Kakehata | ............ H01L 27/1214 |
| | | | 257/507 |
| 2011/0117726 A1 | 5/2011 | Pinnington et al. | |
| 2011/0147772 A1 | 6/2011 | Lochtefeld et al. | |
| 2011/0278598 A1 | 11/2011 | Renaud | |
| 2012/0163247 A1 | 6/2012 | Shimamoto et al. | |
| 2014/0021483 A1 | 1/2014 | Chu et al. | |
| 2015/0162424 A1 | 6/2015 | Briere | |
| 2015/0255591 A1 | 9/2015 | Sadaka | |
| 2017/0110314 A1 | 4/2017 | Odnoblyudov et al. | |
| 2017/0250273 A1 | 8/2017 | Schultz et al. | |
| 2017/0288055 A1 | 10/2017 | Aktas et al. | |
| 2017/0309676 A1 | 10/2017 | Odnoblyudov et al. | |
| 2018/0005827 A1 | 1/2018 | Odnoblyudov et al. | |
| 2020/0227251 A1* | 7/2020 | Odnoblyudov | ..... H01L 29/2003 |

OTHER PUBLICATIONS

Non-Final Office Action dated Oct. 30, 2020 in related U.S. Appl. No. 16/812,112, filed Mar. 6, 2020 (eight pages).

International Search Report and Written Opinion of the International Searching Authority dated Apr. 19, 2018 of International Application No. PCT/US18/17405 (eight pages).

Non-Final Office Action in related U.S. Appl. No. 15/891,205 dated Jan. 22, 2019 (eleven pages).

Notice of Allowance in related U.S. Appl. No. 15/891,205 dated Dec. 18, 2019 (eight pages).

Taiwanese Office Action dated Apr. 15, 2021 in related Taiwanese Application No. 107105152, filed Feb. 13, 2018 (eight pages).

* cited by examiner

RF DEVICE INTEGRATED ON AN ENGINEERED SUBSTRATE

CROSS-REFERENCES TO RELATED APPLICATIONS

This application is a continuation application of U.S. patent application Ser. No. 15/891,205, filed on Feb. 7, 2018, now U.S. Pat. No. 10,622,468, which claims benefit of U.S. Provisional Patent Application No. 62/461,722, filed on Feb. 21, 2017, the contents of which are incorporated by reference in their entireties.

BACKGROUND OF THE INVENTION

High frequency, high performance radio frequency (RF) integrated devices, such as high frequency transistors or high-electron-mobility transistors (HEMTs), may be fabricated using compound semiconductor. For example, to fabricate RF devices, epitaxial layers, such as gallium nitride (GaN), may be formed by a heteroepitaxial (epi) growth process that involves depositing GaN on a semiconductor carrier substrate having a different lattice structure (or lattice constant) than the deposited GaN, such as silicon, silicon carbide (SiC), sapphire, or other substrate. The lattice mismatch between the GaN and the carrier substrate may create defects, dislocations, and strains that may negatively impact device yields and performance. In addition, the GaN layers and carrier substrate may have different coefficients of thermal expansion (CTEs). Thermal processing (e.g., GaN epitaxial growth) can crack or delaminate the GaN, or bow and, in some cases, break the carrier substrate. The different CTEs may restrict substrate wafer size, limit scale, and prevent reduction of the overall manufacturing cost of RF devices and solutions.

SUMMARY OF THE INVENTION

The present invention relates generally to RF devices including compound semiconductors that may be fabricated on engineered substrates. More specifically, the present invention relates to methods and systems for fabricating RF devices integrated with coplanar waveguides on an RF substrate that includes an interlayer structure on a polycrystalline core. Merely by way of example, the invention has been applied to a method and system for providing an RF substrate that includes an embedded metal layer in the interlayer structure, forming an epitaxial GaN layer on the RF substrate, and forming one or more vias through the epitaxial GaN layer to be in contact with the embedded metal layer. The methods and techniques can be applied to a variety of semiconductor processing operations.

According to some embodiments of the present invention, a substrate for RF devices may include a polycrystalline ceramic core and an interlayer structure. The interlayer structure may include a first silicon oxide layer coupled to the polycrystalline ceramic core, a polysilicon layer coupled to the first silicon oxide layer, a second silicon oxide layer coupled to the polysilicon layer, a barrier layer coupled to the second silicon oxide layer, a third silicon oxide layer coupled to the barrier layer, and a substantially single crystalline silicon layer coupled to the third silicon oxide layer.

According to some other embodiments of the present invention, an RF device may include a polycrystalline ceramic core and an interlayer structure. The interlayer structure may include a first silicon oxide layer coupled to the polycrystalline ceramic core, a polysilicon layer coupled to the first silicon oxide layer, a second silicon oxide layer coupled to the polysilicon layer, a first silicon nitride layer coupled to the second silicon oxide layer, a metal layer coupled to the first silicon nitride layer, a second silicon nitride layer coupled to the metal layer, a third silicon oxide layer coupled to the second silicon nitride layer, and a substantially single crystalline silicon layer coupled to the third silicon oxide layer. The RF device may further include an epitaxial gallium nitride (GaN) layer coupled to the substantially single crystalline silicon layer, a two-dimensional electron gas (2DEG) inducing layer coupled to the epitaxial GaN layer, and a field effect transistors (FET). The FET may include a drain coupled to a first region of the 2DEG inducing layer, a source coupled to a second region of the 2DEG inducing layer, a gate dielectric layer coupled to a third region of the 2DEG inducing layer, and a gate coupled to the gate dielectric layer. The RF device may further include a first via through the epitaxial GaN layer and the 2DEG inducing layer. The first via couples the source to the metal layer of the interlayer structure, where the metal layer is connected to ground.

According to some further embodiments of the present invention, a method of fabricating an RF device may include providing a polycrystalline ceramic core, and forming an interlayer structure coupled to the polycrystalline ceramic core. The interlayer structure may include a first silicon oxide layer coupled to the polycrystalline ceramic core, a polysilicon layer coupled to the first silicon oxide layer, a second silicon oxide layer coupled to the polysilicon layer, a barrier layer coupled to the second silicon oxide layer, a third silicon oxide layer coupled to the barrier layer, and a substantially single crystalline silicon layer coupled to the third silicon oxide layer. The method may further include growing an epitaxial GaN layer coupled to the substantially single crystalline silicon layer, growing a two-dimensional electron gas (2DEG) inducing layer coupled to the epitaxial GaN layer, and forming a field effect transistor (FET). The FET may include a drain coupled to a first region of the 2DEG inducing layer, a source coupled to a second region of the 2DEG inducing layer, a gate dielectric layer coupled to a third region of the 2DEG inducing layer, and a gate coupled to the gate dielectric layer.

Numerous benefits are achieved by way of the present invention over conventional techniques. For example, embodiments of the present invention provide systems and methods for fabricating RF devices integrated with coplanar waveguides on an RF substrate that can operate at high frequencies. Furthermore, embodiments of the present invention provide RF device structures that can reduce the thermal resistance of the layers in the RF devices and reduce the inductance and/or impedance from terminals of the RF devices to ground, which can enable the high frequency operations.

These and other embodiments of the invention along with many of its advantages and features are described in more detail in conjunction with the text below and attached figures.

DETAILED DESCRIPTION OF THE INVENTION

The present invention relates generally to compound semiconductor-based radio frequency (RF) integrated circuits using an engineered substrate. More specifically, the present invention relates to high performance, high density, low cost RF integrated circuits, such as gallium nitride (GaN) integrated circuits, using an engineered substrate and a plurality of groups of epitaxial layers, where the coefficient of thermal expansion (CTE) of the engineered substrate substantially matches the CTE of the epitaxial layers. The methods and techniques can be applied to a variety of semiconductor processing operations. It is noted that although GaN RF integrated circuits are used as examples in some embodiments described below, other compound semiconductor-based RF integrated circuits may be made using the methods and techniques disclosed here.

Figure 1:
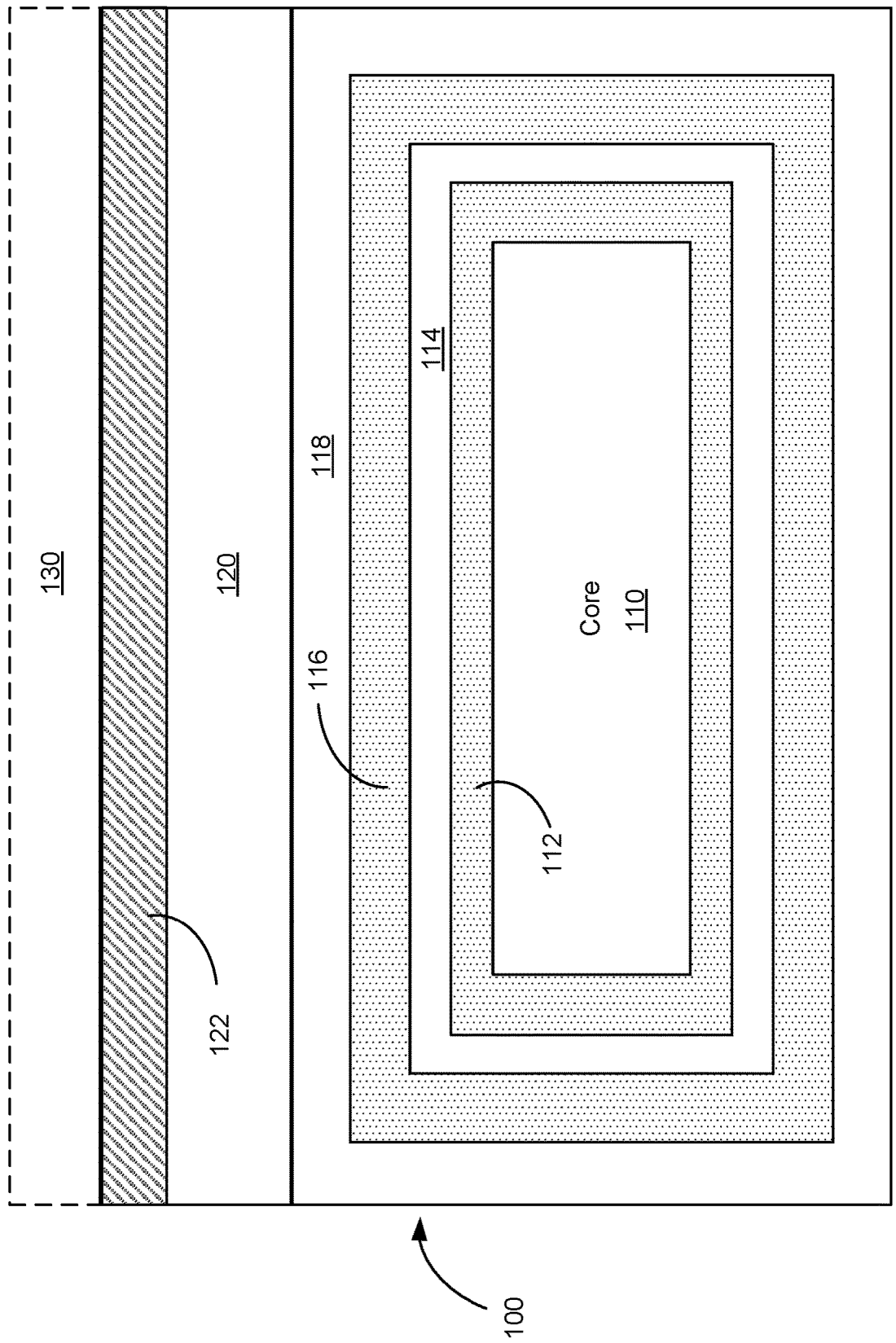
FIG. 1 is a simplified schematic diagram illustrating an engineered substrate structure according to an embodiment of the present invention.

FIG. 1 is a simplified schematic diagram illustrating an engineered substrate 100, according to an embodiment of the present invention. Engineered substrate 100 illustrated in FIG. 1 is suitable for a variety of electronic and optical applications. Engineered substrate 100 includes a core 110 that can have a coefficient of thermal expansion (CTE) that is substantially matched to the CTE of the epitaxial material that will be grown on engineered substrate 100. An epitaxial material 130 is illustrated as optional because it is not required as an element of engineered substrate 100, but will typically be grown on engineered substrate 100.

For applications including the growth of gallium nitride (GaN)-based materials (epitaxial layers including GaN-based layers), core 110 can be a polycrystalline ceramic material, for example, polycrystalline aluminum nitride (AlN), which may include binding agents, such as yttrium oxide. Other materials can be utilized as core 110, including polycrystalline gallium nitride (GaN), polycrystalline aluminum gallium nitride (AlGaN), polycrystalline silicon carbide (SiC), polycrystalline zinc oxide (ZnO), polycrystalline gallium trioxide ($Ga_2O_3$), and the like. The thickness of core 110 can be on the order of 100 to 1,500 μm, for example, 750 μm.

Core 110 may be encapsulated in a first adhesion layer 112 that can be referred to as a shell or an encapsulating shell.

In an embodiment, first adhesion layer 112 comprises a tetraethyl orthosilicate (TEOS) oxide layer on the order of 1,000 Å in thickness. In other embodiments, the thickness of first adhesion layer 112 varies, for example, from 100 Å to 2,000 Å. Although TEOS oxides can be utilized for adhesion layers in some embodiments, other materials that provide for adhesion between later deposited layers and underlying layers or materials (e.g., ceramics, in particular, polycrystalline ceramics) can be utilized according to other embodiments of the present invention. For example, $SiO_2$ or other silicon oxides ($Si_xO_y$) may adhere well to ceramic materials and may provide a suitable surface for subsequent deposition, for example, of conductive materials. In some embodiments, first adhesion layer 112 completely surrounds core 110 in some embodiments to form a fully encapsulated core and can be formed using an LPCVD process or other suitable deposition processes, which can be compatible with semiconductor processing, and in particular, with polycrystalline or composite substrates and layers. In some embodiments, first adhesion layer 112 may be formed on one side of core 110. First adhesion layer 112 provides a surface on which subsequent layers adhere to form elements of the engineered substrate structure.

In addition to the use of LPCVD processes, spin on glass/dielectrics, furnace-based processes, and the like, to form the encapsulating adhesion layer, other semiconductor processes can be utilized according to embodiments of the present invention, including CVD processes or similar deposition processes. As an example, a deposition process that coats a portion of the core can be utilized; the core can be flipped over, and the deposition process could be repeated to coat additional portions of the core. Thus, although LPCVD techniques are utilized in some embodiments to provide a fully encapsulated structure, other film formation techniques can be utilized, depending on the particular application.

A conductive layer 114 is formed on first adhesion layer 112. In an embodiment, conductive layer 114 is a shell of polysilicon (i.e., polycrystalline silicon) that is formed surrounding first adhesion layer 112 since polysilicon can exhibit poor adhesion to ceramic materials. In embodiments in which conductive layer 114 is polysilicon, the thickness of the polysilicon layer can be on the order of 500-5,000 Å, for example, 2,500 Å. In some embodiments, the polysilicon layer can be formed as a shell to completely surround first adhesion layer 112 (e.g., a TEOS oxide layer), thereby forming a fully encapsulated adhesion layer, and can be formed using an LPCVD process. In other embodiments, the conductive material can be formed on a portion of the adhesion layer, for example, an upper half of the substrate structure. In some embodiments, the conductive material can be formed as a fully encapsulating layer and can be subsequently removed on one side of the substrate structure.

In an embodiment, conductive layer 114 can be a polysilicon layer doped to provide a highly conductive material. for example, conductive layer 114 may be doped with boron to provide a p-type polysilicon layer. In some embodiments, the doping with boron is at a level of $1 \times 10^{19}$ $cm^{-3}$ to $1 \times 10^{20}$ $cm^{-3}$ to provide for high conductivity. Other dopants at different dopant concentrations (e.g., phosphorus, arsenic, bismuth, or the like at dopant concentrations ranging from $1 \times 10^{16}$ $cm^{-3}$ to $5 \times 10^{18}$ $cm^{-3}$) can be utilized to provide either n-type or p-type semiconductor materials suitable for use in the conductive layer. One of ordinary skill in the art would recognize many variations, modifications, and alternatives.

The presence of conductive layer 114 is useful during electrostatic chucking of the engineered substrate to semiconductor processing tools, for example tools with electrostatic chucks (ESCs or e-chucks). Conductive layer 114 enables rapid dechucking after processing in the semiconductor processing tools. In embodiments of the present invention, the conductive layer enables electrical contact with the chuck or capacitive coupling to the e-chuck during future processing including bonding. Thus, embodiments of the present invention provide substrate structures that can be processed in manners utilized with conventional silicon wafers. One of ordinary skill in the art would recognize many variations, modifications, and alternatives. Additionally, having a substrate structure with high thermal conductivity in combination with the ESD chucking may provide better deposition conditions for the subsequent formation of engineered layers and epitaxial layers, as well as for the subsequent device fabrication steps. For example, it may provide desirable thermal profiles that can result in lower stress, more uniform deposition thicknesses, and better stoichiometry control through the subsequent layer formations.

A second adhesion layer 116 (e.g., a TEOS oxide layer on the order of 1,000 Å in thickness) is formed on conductive layer 114. Second adhesion layer 116 completely surrounds conductive layer 114 in some embodiments to form a fully encapsulated structure and can be formed using an LPCVD process, a CVD process, or any other suitable deposition process, including the deposition of a spin-on dielectric.

A barrier layer 118, for example, a silicon nitride layer, is formed on second adhesion layer 116. In an embodiment, barrier layer 118 is a silicon nitride layer that is on the order of 4,000 Å to 5,000 Å in thickness. Barrier layer 118 completely surrounds the second adhesion layer in some embodiments to form a fully encapsulated structure and can be formed using an LPCVD process. In addition to silicon nitride layers, amorphous materials including SiCN, SiON, AlN, SiC, and the like can be utilized as the barrier layers. In some implementations, barrier layer 118 includes a number of sub-layers that are built up to form barrier layer 118. Thus, the term barrier layer is not intended to denote a single layer or a single material, but is to encompass one or more materials layered in a composite manner. One of ordinary skill in the art would recognize many variations, modifications, and alternatives.

In some embodiments, barrier layer 118, e.g., a silicon nitride layer, prevents diffusion and/or outgassing of elements present in the core, for example, yttrium (elemental), yttrium oxide (i.e., yttria), oxygen, metallic impurities, other trace elements, and the like, into the environment of the semiconductor processing chambers in which the engineered substrate could be present, for example, during a high temperature (e.g., 1,000° C.) epitaxial growth process. Utilizing the encapsulating layers described herein, ceramic materials, including polycrystalline AlN, that are designed for non-clean room environments, can be utilized in semiconductor process flows and clean room environments.

In some embodiments, ceramic materials utilized to form the core may be fired at temperatures in the range of 1,800° C. It would be expected that this process would drive out a significant amount of impurities present in the ceramic materials. These impurities can include yttrium, which results from the use of yttria as sintering agent, calcium, and other elements and compounds. Subsequently, during epitaxial growth processes, which may be conducted at much lower temperatures in the range of 800° C. to 1,100° C., it would be expected that the subsequent diffusion of these impurities would be insignificant. However, contrary to conventional expectations, even during epitaxial growth processes at temperatures much lower than the firing temperature of the ceramic materials, significant diffusion of elements through the layers of the engineered substrate may be present. Thus, embodiments of the present invention integrate the barrier layer into the engineered substrate structure to prevent this undesirable diffusion.

Thus, embodiments of the present invention integrate a silicon nitride layer to prevent out-diffusion of the background elements from the polycrystalline ceramic material (e.g., AlN) into the engineered layers and epitaxial layers such as optional GaN layer 130. The silicon nitride layer 118 encapsulating the underlying layers and material provides the desired barrier layer functionality. The integration of the silicon nitride layer 118 into the engineered substrate structure prevents the diffusion of calcium, yttrium, and aluminum into the engineered layers during the annealing process that occurred when the silicon nitride layer was not present. Thus, the use of the silicon nitride layer 118 prevents these elements from diffusing through the diffusion barrier and thereby prevents their release into the environment surrounding the engineered substrate. Similarly, any other impurities containing within the bulk ceramic material would be contained by the barrier layer.

A bonding layer 120 (e.g., a silicon oxide layer) may be deposited on a portion of barrier layer 118, for example, on the top surface of barrier layer 118, and subsequently used during the bonding of a substantially single crystal layer 122 (e.g., a single crystal silicon layer such as exfoliated silicon (111) layer). Bonding layer 120 can be approximately 1.5 µm in thickness in some embodiments. In some embodiments, the thickness of bonding layer 120 is 20 nm or more for bond-induced void mitigation. In some embodiments, the thickness of bonding layer 120 is in the range of 0.75-1.5 µm.

Bonding layer 120 can be formed by a deposition of a thick (e.g., 2-5 µm thick) oxide layer followed by a chemical mechanical polishing (CMP) process to thin the oxide to approximately 1.5 µm or less in thickness. The thick initial oxide serves to smooth surface features present on the support structure that may remain after fabrication of the polycrystalline core and continue to be present as the encapsulating layers illustrated in FIG. 1 are formed. The CMP process provides a substantially planar surface free of voids, which can then be used during a wafer transfer process to bond single crystal silicon layer 122 to bonding layer 120.

The substantially single crystal layer 122 (e.g., exfoliated Si (111)) is suitable for use as a growth layer during an epitaxial growth process for the formation of epitaxial materials. In some embodiments, the epitaxial material can include a GaN layer of 2 µm to 10 µm in thickness, which can be utilized as one of a plurality of layers utilized in optoelectronic, RF, and power devices. In an embodiment, substantially single crystal layer 122 includes a single crystal silicon layer that is attached to the bonding layer using a layer transfer process.

A layer transfer process may be performed using a silicon wafer. The silicon wafer may be implanted with several elements to create a damage interface inside Si, which may help to form single crystal layer 122 for attaching to bonding layer 120. For example, applying pressure on the silicon wafer and bonding layer 120 that are attached together may atomically bond the silicon wafer to bonding layer 120.

After the bonding process, an exfoliation process may activate the damage interface inside the silicon wafer and cause the implanted elements in single crystal layer 122 to expand, thus splitting the top portion of the silicon wafer from ceramic wafer 110 with engineered layers. Remaining single crystal layer 122 bonded to bonding layer 120 may be relatively thin, such as less than around 5 microns, and therefore may not significantly contribute to the CTE of engineered substrate 100. The CTE of engineered substrate 100 is therefore primarily determined by the CTE of ceramic core 110.

Materials other than silicon may be used to create a single crystal thin bonding layer. These single crystal materials may include SiC, GaN, AlGaN, AlN, ZnO, sapphire, and other.

GaN epitaxial layer 130 (which may also be referred to as epitaxial layers) can be formed by epitaxially growing a number of layers or sub-layers to form an epitaxial structure on top of engineered substrate 110. As used herein, the term "layer" should be understood to include a structure including multiple layers or sub-layers of the same or different materials. In some embodiments, a buffer layer may be formed on bonding layer 120, and GaN epitaxial layer 130 (epitaxial layers) may be formed on top of the buffer layer. The CTEs of ceramic wafer 110 and GaN epitaxial layer 130 may be substantially matched over a wide temperature range (e.g., from about 25° C. to about 1200° C.), such as within about 0.1%, 0.5%, 1%, 2%, 5%, or 10% of each other. This CTE matching enables the formation of higher quality epitaxial layers on larger ceramic wafers 110 without cracking or warping. For example, GaN epitaxial layer 130 may be formed on 6-inch, 8-inch, 12-inch, or larger engineered substrates 100. Using larger wafers may increase the device count per wafer and thus result in less expensive GaN devices.

The CTE matching may also enable the formation of a significantly thicker GaN epitaxial layer 130 (e.g., tens or hundreds of microns) on top of engineered substrate 110. The combined epitaxial layers may reduce the overall dislocation density of the lattice structures between GaN epitaxial layer 130 and single crystal layer 122. In addition, a larger number of epitaxial layers can be used to fabricate more complex circuity for a wider array of GaN devices.

Additional description related to the engineered substrate structure is provided in U.S. patent application Ser. No. 15/621,335, filed on Jun. 13, 2017, and U.S. patent application Ser. No. 15/621,235, filed on Jun. 13, 2017, the disclosures of which are hereby incorporated by reference in their entirety for all purposes.

Figure 2:
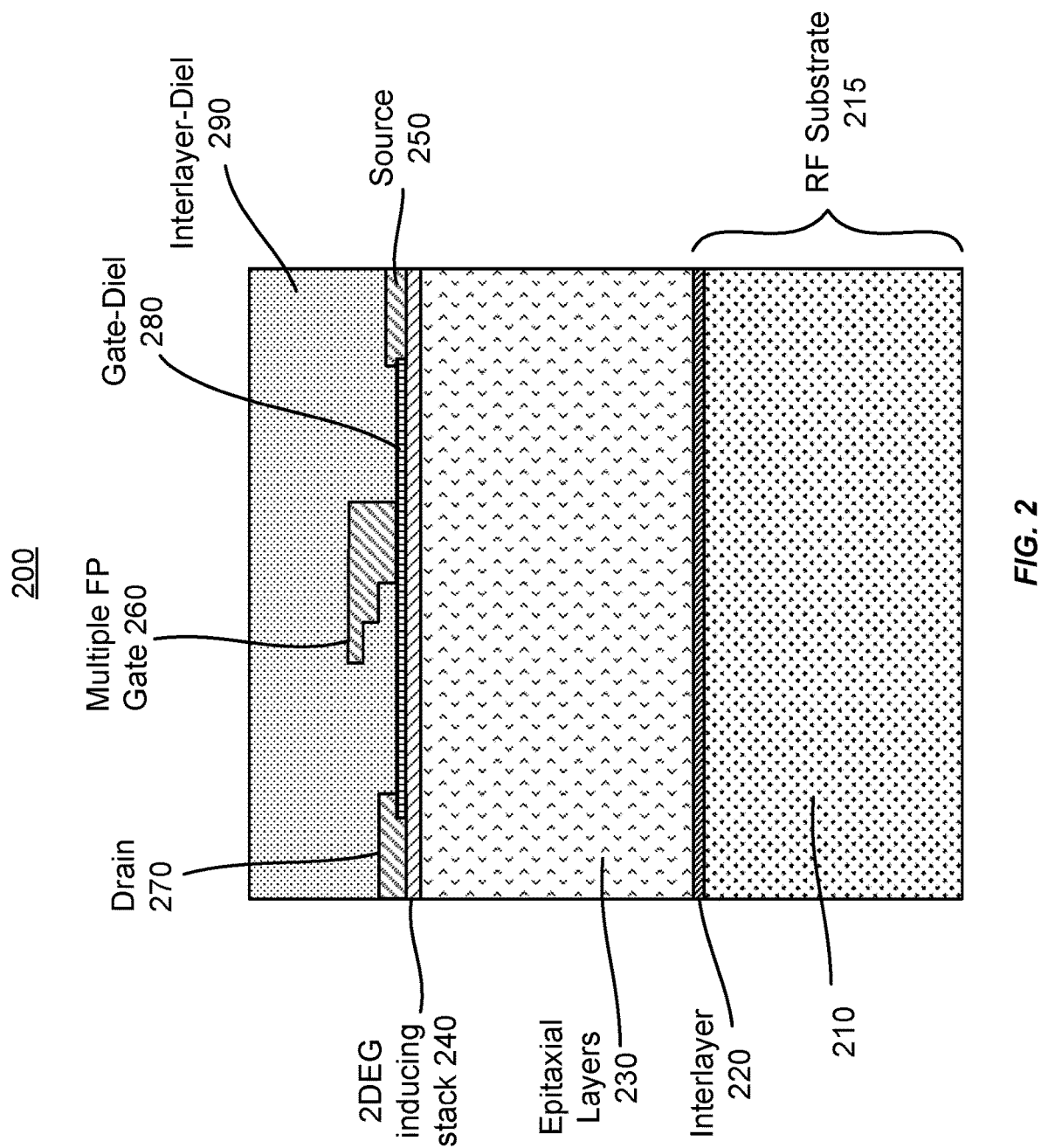
FIG. 2 is a cross-sectional view of a radio frequency (RF) integrated circuit formed on an engineered substrate according to an embodiment of the present invention.

FIG. 2 is a cross-sectional schematic diagram of an RF integrated circuit 200 formed on an RF substrate 215, according to an embodiment of the present invention. The RF integrated circuit 200 includes a polycrystalline core 210 with a polycrystalline ceramic material, such as polycrystalline aluminum nitride (AlN). In some embodiments, the polycrystalline core 210 may be thinned to reduce thermal resistance of the polycrystalline core. For example, the polycrystalline core 210 may be thinned to have a thickness of less than about 100 μm, less than about 50 μm, less than about 25 μm, or less. An interlayer structure 220 is formed on polycrystalline core 210. The interlayer structure 220 may include a first adhesion layer (e.g., first adhesion layer 112 of FIG. 1, such as a TEOS or silicon oxide layer), a conductive layer (e.g., conductive layer 114, such as a polysilicon layer), a second adhesion layer (e.g., second adhesion layer 116, such as a TEOS or silicon oxide layer), and a barrier layer (e.g., barrier layer 118, such as a silicon nitride layer). The interlayer structure 220 may also include a bonding layer (e.g., bonding layer 120, such as a silicon oxide layer), and a substantially single crystal layer (e.g., single crystal layer 122, such as a single crystal silicon layer). The combination of the polycrystalline core 210 and the interlayer structure 220 may be referred herein as the RF substrate 215. As discussed with reference to FIG. 1, one or more layers (e.g., the first adhesion layer, the conductive layer, the second adhesion layer, and the barrier layer) in the interlayer structure 220 may encapsulate the polycrystalline core 210.

The RF integrated circuit 200 may include one or more epitaxial layers 230, such as one or more GaN layers, and a two-dimensional electron gas (2DEG) inducing layer 240. The one or more epitaxial GaN layers 230 may form a high voltage blocking structure that has a uniform electric field at the surface of such a structure, which allows the structure to block a voltage that is close to the theoretical limit of the device. This limit may be defined by the critical field of the semiconductor material and the separation distance between two terminals that have a high voltage potential between them. The GaN blocking structure may also keep RF energy inside the structure. A 2DEG may be induced by a combination of piezoelectric effect (stress), bandgap differential, and polarization charge. The 2DEG inducing layer 240 may include one or more of AlGaN, AlN, or other material. In some embodiment, the 2DEG inducing layer 240 may include two closely spaced heterojunction interfaces to confine electrons to a rectangular quantum well.

The RF integrated circuit 200 may also include one or more transistors formed on 2DEG inducing layer 240. The transistors may include a field-effect transistor (FET) that includes a source 250, a gate 260, and a drain 270. The source 250 and the drain 270 may be coupled to the 2DEG inducing layer 240. The gate 260 may be a multiple field-plate gate that is isolated from the 2DEG inducing layer 240 by a gate dielectric 280. The transistors may be encapsulated by an interlayer dielectric 290.

The RF integrated circuit 200 may also include a coplanar waveguide (not shown in FIG. 2) formed on the epitaxial layer 230. The RF integrated circuit 200 with the coplanar waveguide may be able to operate at high frequencies and may be relatively easy to fabricate. As described above, the CTE matching between the substrate and the epitaxial layers enables extremely low defect density device layers, the ability to grow a broader range of thicknesses on the compliant template materials, and improved thermal performance.

In various embodiments, one or more layers in the interlayer structure 220 may be thinned to reduce the thermal resistance of the RF substrate 215. In some embodiments, at least one of the bonding layer or the adhesion layer between the barrier layer and the conductive layer may be completely removed (i.e., with a thickness of zero). Table 1 shows some exemplary thicknesses of various layers in an RF substrate 215 according to various embodiments. The first column shows the thicknesses of various layers in an RF substrate 215 with relatively thick silicon oxide layers. The second column shows the thicknesses of various layers in an RF substrate 215 with relatively thin silicon oxide layers. The third column shows the thicknesses of various layers in an RF substrate 215 with no silicon oxide layer (NO). Table 2 shows exemplary temperature differences (Delta T) across the RF substrate 215 with the three types of interlayer structures 220 shown in Table 1. As illustrated in Tables 1 and 2, thinning the $SiO_2$ layer can significantly reduce the thermal resistance of the RF substrate 215, and thus the temperature gradient within the RF substrate 215.

TABLE 1

Example thicknesses of various layers in the RF substrate

|  | Thick Oxide (μm) | Thin Oxide (μm) | NO (μm) |
|---|---|---|---|
| Single Crystal (Si) | 0.4 | 0.2 | 0.2 |
| Bonding (SiO$_2$) | 1.5 | 0.25 | 0 |
| Barrier (SiN) | 0.4 | 0.4 | 0.4 |
| Adhesion (SiO$_2$) | 0.1 | 0.05 | 0 |
| Conductive (Si) | 0.3 | 0.3 | 0.3 |
| Adhesion (SiO$_2$) | 0.1 | 0.1 | 0.1 |
| Core (AlN) | 25 | 25 | 25 |

TABLE 2

Approximate Delta T (K) within the RF substrate

|  | Single Finger (1 W/mm) | 10 μm Periodic Fingers (1 W/mm/finger) |
|---|---|---|
| Thick Oxide | 23 | 153 |
| Thin Oxide | 15 | 63 |
| NO | ~11 | ~40 |

According to some other embodiments, in addition to completely removing the silicon oxide layers (NO, as shown in the third column in Table 1), the conductive layer (e.g., Si) may also be completely removed. Such an RF substrate 215 may minimize absorption of RF energy in the interlayer structure 220, while keeping the temperature profile similar to or better than that exhibited by the RF substrate 215 with only the silicon oxide layers removed.

In devices such as HEMTs, field plates may be used to manipulate electric field distribution to reduce the peak value of the electric field. However, the field plates may add parasitic capacitance between the terminals. Thus, in large RF devices, air-bridges may be used on the top side metallization to reduce the parasitic capacitance between conductors, such as gate, source, and drain electrodes. The air-bridges may extend from the electrode pad areas to various components of the RF devices. The air-bridges may be formed of conductive material applied by electro-deposition or electroplating techniques, such as gold (Au) plating.

Figure 3A:
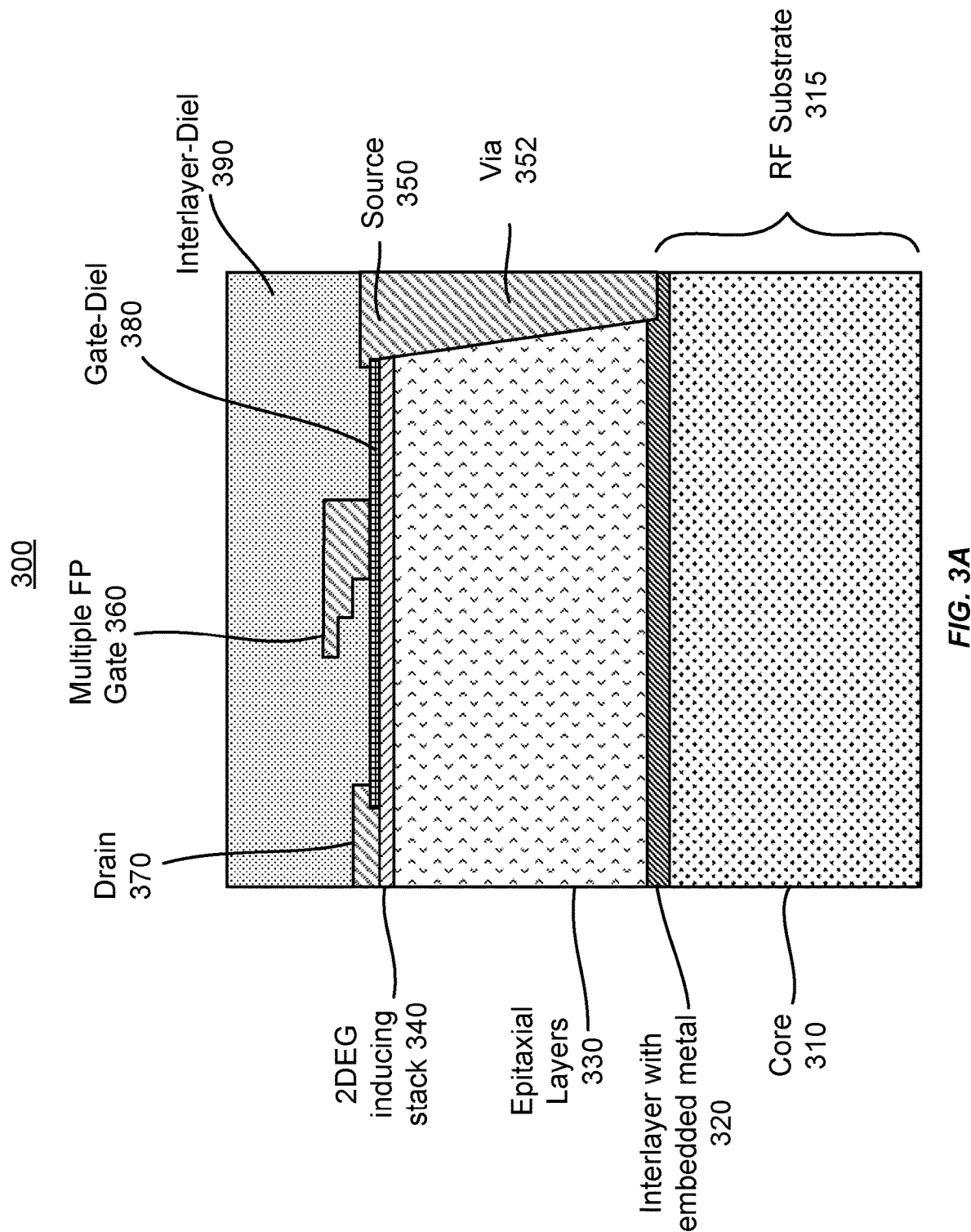
FIG. 3A is a cross-sectional view of an RF integrated circuit on an engineered substrate according to another embodiment of the present invention.

FIG. 3A is a cross-sectional view of an RF integrated circuit 300 including a grounded coplanar waveguide formed on an RF substrate 315, according to an embodiment of the present invention. Similar to the RF integrated circuit 200, the RF integrated circuit 300 may include a polycrystalline core 310 with a polycrystalline ceramic material, such as polycrystalline aluminum nitride (AlN). In some embodiments, the polycrystalline core 310 may be thinned to reduce thermal resistance of the polycrystalline core 310. For example, the polycrystalline core 310 may be thinned to have a thickness of less than about 100 μm, less than about 50 μm, less than about 25 μm, or less. An interlayer structure 320 may be formed on the polycrystalline core 310. The interlayer structure 320 and the polycrystalline core 310 may collectively form the RF substrate 315. The interlayer structure 320 may include a first adhesion layer (e.g., a TEOS or silicon oxide layer), a conductive layer (e.g., a polysilicon layer), a second adhesion layer (e.g., a TEOS or silicon oxide layer), and a barrier layer (e.g., a silicon nitride layer). The interlayer structure 320 may also include a bonding layer (e.g., a silicon oxide layer), and a substantially single crystal layer (e.g., a single crystal silicon layer). As discussed with reference to FIG. 1, one or more layers (e.g., the first adhesion layer, the conductive layer, the second adhesion layer, and the barrier layer) in the interlayer structure 320 may encapsulate the polycrystalline core 310.

Similar to the RF integrated circuit 200, the RF integrated circuit 300 may include one or more epitaxial layers 330, such as one or more GaN layers, and a two-dimensional electron gas (2DEG) inducing layer 340. The RF integrated circuit 300 may also include one or more transistors formed on the 2DEG inducing layer 340. The transistors may include a FET that includes a source 350, a gate 360, and a drain 370. The drain 370 may be connected to the 2DEG inducing layer 340. The gate 360 may be a multiple field-plate gate that is isolated from the 2DEG inducing layer 340 by a gate dielectric 380. The transistors may be encapsulated by an interlayer dielectric 390. The RF integrated circuit 300 may also include a coplanar waveguide (not shown in FIG. 3A) formed on the epitaxial layer 330.

In the RF integrated circuit 200 shown in FIG. 2, the FET may have a relatively large inductance to ground. To reduce the inductance to ground, the interlayer structure 320 in the RF integrated circuit 300 may include one or more metal layers embedded in the barrier layer of the interlayer structure 320. One or more holes may be etched through the 2DEG inducing layer 340 and the epitaxial layers 330 down to the interlayer structure 320, and may be filled with a conductive material, such as a metal, to form one or more large vias 352. The source 350 of the FET may be coupled to the one or more metal layers embedded in the barrier layer through the one or more large vias 352. In some embodiments, a thick metal layer (e.g., from about 0.1 to about 10 μm thick) may be embedded in the barrier layer such that the resistance of the metal layer may be very small. In some embodiments, a plurality of thinner metal layers may be embedded in the barrier layer to reduce the resistance of the metal layers, where each of the plurality of metal layers may be separated by a barrier sub-layer, such as a thin SiN layer.

Figure 3B:
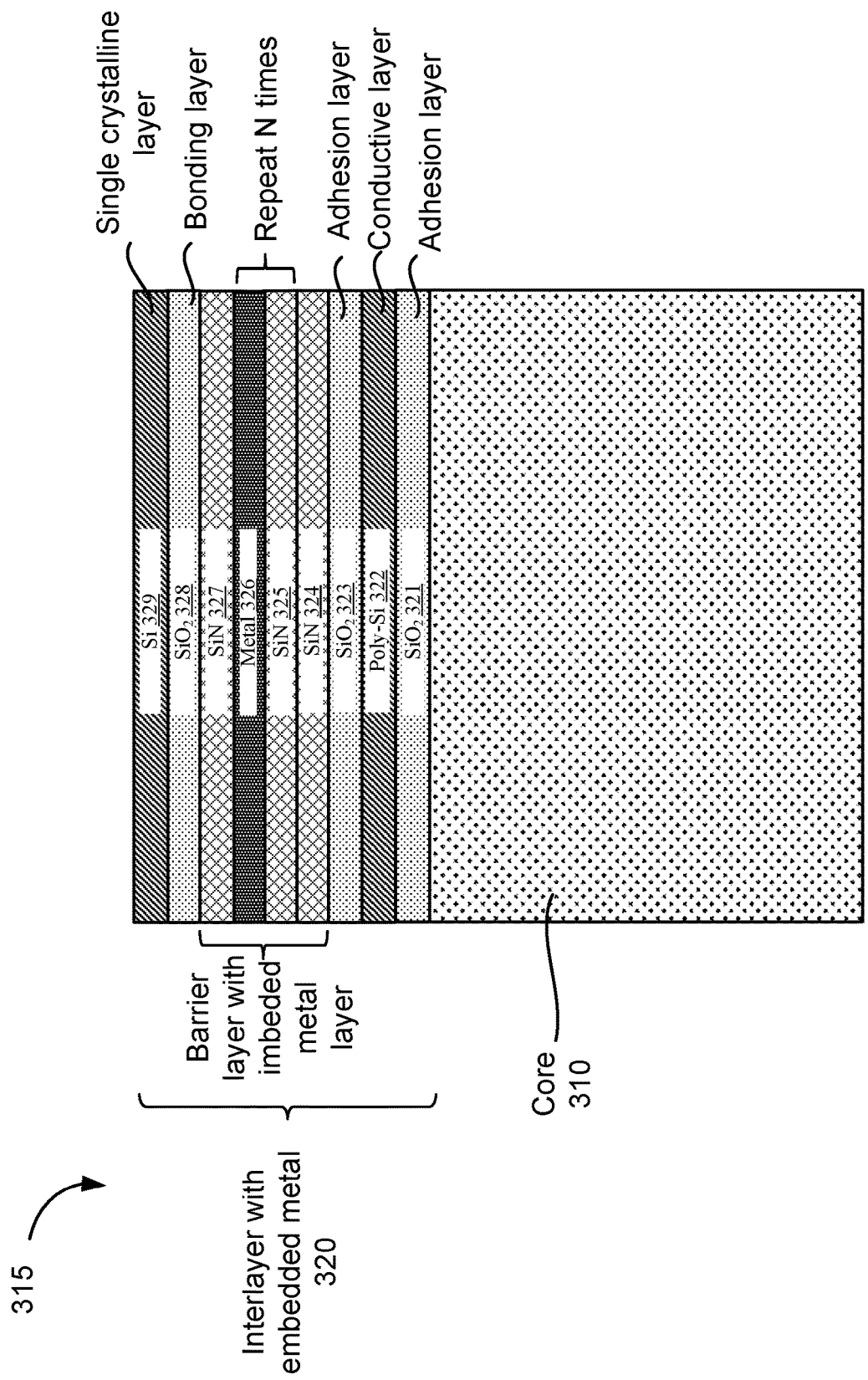
FIG. 3B is a cross-sectional diagram of an RF substrate according to some embodiments of the present invention.

FIG. 3B is a simplified schematic cross-sectional diagram illustrating an RF substrate 315, according to some embodiments of the present invention. The RF substrate 315 includes a core 310 and a interlayer 320 with embedded metal layer(s). The interlayer 320 may include a first adhesion layer 321 (e.g., SiO$_2$), a conductive layer 322 (e.g., polysilicon), a second adhesion layer 323 (e.g., SiO$_2$), a barrier layer, a bonding layer 328 (e.g., SiO$_2$), and a substantially single crystalline layer 329 (e.g., Si). The barrier layer may include a first dielectric layer 324 (e.g., silicon nitride), a second dielectric layer 325 (e.g., silicon nitride), a third dielectric layer 327 (e.g., silicon nitride), and a metal layer 326 sandwiched between the second dielectric layer 325 and the third dielectric layer 327. In some embodiments, the combination of the second dielectric layer 325 and the metal layer 326 may be repeated N times.

As illustrated in FIG. 3A, because the source 350 of the FET is connected to the one or more metal layers 326 embedded in the barrier layer of the interlayer structure 320 through one or more short but large vias 352, the inductance from the source to the ground may be significantly reduced. Thus, the RF integrated circuit 300 with grounded coplanar waveguide may be able to operate at a higher frequency than the RF integrated circuit 200 illustrated in FIG. 2. As described above, the CTE matching between the substrate and the epitaxial layer(s) enables extremely low defect density device layers, the ability to grow a broader range of thicknesses on the compliant template materials, and improved thermal performance. By epitaxially growing the GaN layer 330 over the interlayer 320 with embedded metal layer 326, it may be ensured that the thickness of the GaN layer 330 is uniform (e.g., the variation of the thickness may be controlled to be within 3%, or within 1 nm), so that the ground plane is parallel to the coplanar waveguide. This may be important for achieving low impedance of the coplanar waveguide.

Figure 4:
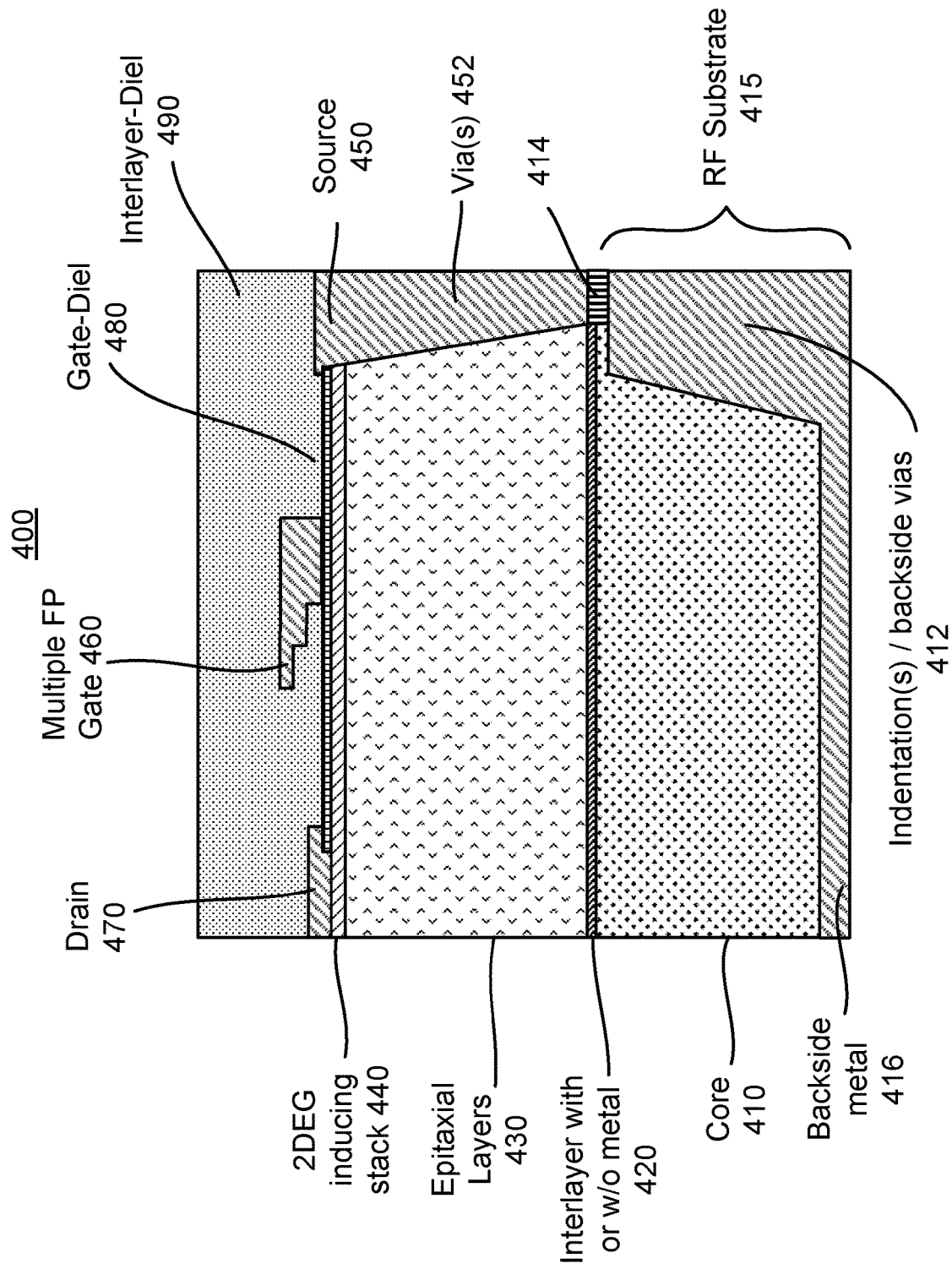
FIG. 4 is a cross-sectional view of an RF integrated circuit formed on an engineered substrate with backside vias and a backside metal layer according to an embodiment of the present invention.

FIG. 4 is a cross-sectional view of an RF integrated circuit 400 including a coplanar waveguide formed on an RF substrate 415 with backside vias and metal, according to an embodiment of the present invention. The RF integrated circuit 400 may be similar to RF integrated circuit 300 illustrated in FIG. 3A, and may include a polycrystalline core 410 with a polycrystalline ceramic material, such as polycrystalline aluminum nitride (AlN). In some embodiments, the polycrystalline core 410 may be thinned to have a thickness of less than about 100 µm, less than about 50 µm, less than about 25 µm, or less. An interlayer structure 420 similar to interlayer structure 220 or 320 may be formed on the polycrystalline core 410. As discussed with reference to FIG. 1, one or more layers (e.g., the first adhesion layer, the conductive layer, the second adhesion layer, and the barrier layer) in the interlayer structure 420 may encapsulate the polycrystalline core 410.

The RF integrated circuit 400 may also include one or more epitaxial layers 430, such as one or more GaN layers, and a two-dimensional electron gas (2DEG) inducing layer 440. The RF integrated circuit 400 may also include one or more transistors formed on the 2DEG inducing layer 440. The transistors may include a FET that includes a source 450, a gate 460, and a drain 470. The drain 470 may be connected to the 2DEG inducing layer 440. The gate 460 may be a multiple field-plate gate that is isolated from the 2DEG inducing layer 440 by a gate dielectric 480. The transistors may be encapsulated by an interlayer dielectric 490. One or more holes may be etched through the 2DEG inducing layer 440 and the epitaxial layers 430 down to the interlayer structure 420, and may be filled with a conductive material, such as a metal, to form the vias 452.

In the RF integrated circuit 400, the polycrystalline core 410 may also include a plurality of indentations 412 on a surface (e.g., bottom surface) of the polycrystalline ceramic core 410 opposite to the first adhesion layer. The thickness of the ceramic core 410 in locations corresponding to the plurality of indentations 412 may be reduced to, for example, less than 10 µm, due to the indentations. In some embodiments, the indentations 412 may be pre-formed in the polycrystalline core 410 during pressing. In some embodiments, the indentations 412 may be formed in the polycrystalline core 410 through wet or dry etching. A through hole 414 may be etched in the polycrystalline core 410 and/or the interlayer structure 420 in locations corresponding to the plurality of indentations 412. Because the thickness of the polycrystalline core 410 in locations corresponding to the plurality of indentations 412 is reduced due to the indentations 412, the through hole 414 may be relatively easy to etch.

The RF integrated circuit 400 may include a backside metal layer 416 formed on the (bottom) surface of the polycrystalline core 410 opposite to the first adhesion layer and filling the plurality of indentations 412 and the through holes 414 etched in the polycrystalline core 410 and/or the interlayer structure 420 at the locations corresponding to the plurality of indentations 412. The metal-filled indentations 412 form backside vias 412. Thus, the source 450 may be in contact with the backside metal layer 416 through the vias 452 and the backside vias 412. The backside metal layer 416 and/or one or more metal layers embedded in the barrier layer (optional) inside the interlayer 420 may be grounded. As such, the source 450 may have a very low inductance to the ground plane, and the RF integrated circuit 400 may operate at an even higher frequency than the RF integrated circuit 300 illustrated in FIG. 3A. Furthermore, because of the backside metal layer 416, air-bridges may not be needed in the RF integrated circuit 400.

Figure 5:
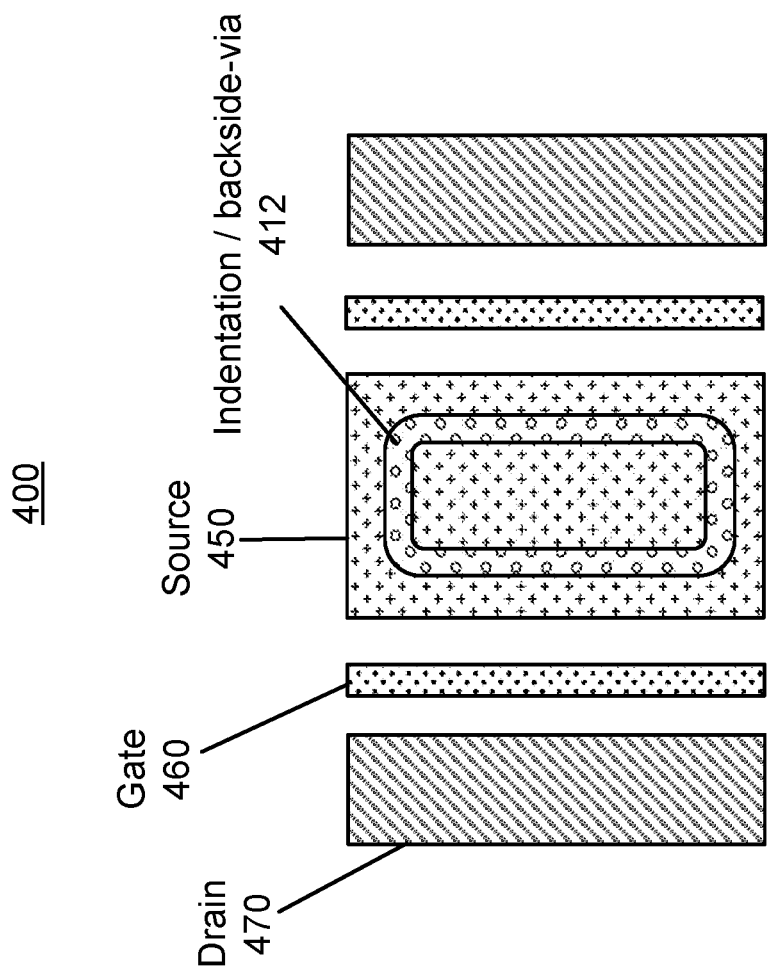
FIG. 5 is a plan view of the RF integrated circuit shown in FIG. 4 according to some embodiments of the present invention.

FIG. 5 is a plan view of the RF integrated circuit 400 including the coplanar waveguide formed on the RF substrate 415 with the backside vias 412 shown in FIG. 4. FIG. 5 shows that the backside vias 412 may be formed underneath the source region 450.

Figure 6:
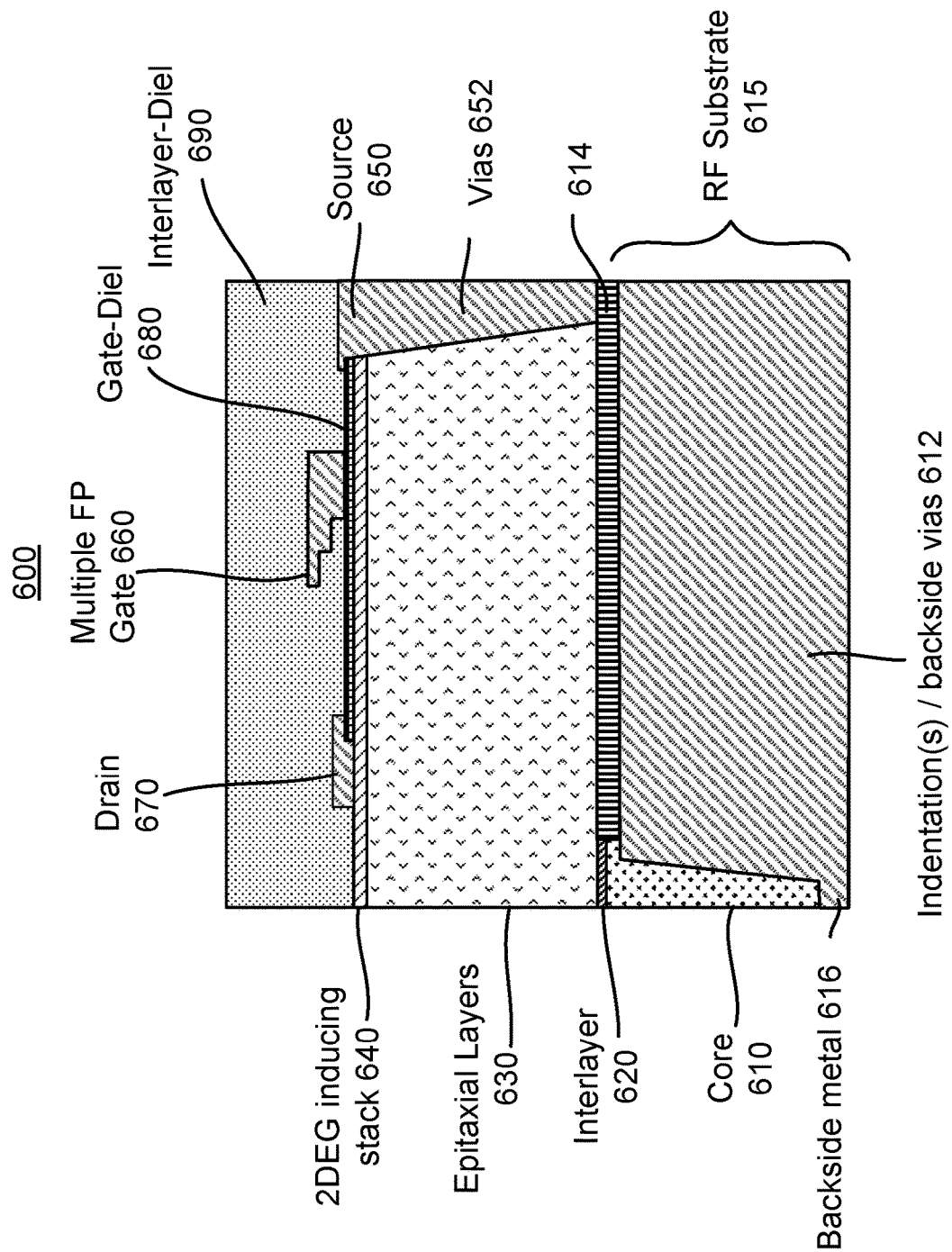
FIG. 6 is a cross-sectional view of an RF integrated circuit formed on an engineered substrate with a backside ground plane according to an embodiment of the present invention.

FIG. 6 a cross-sectional view of an RF integrated circuit 600 including a coplanar waveguide formed on an RF substrate 615 with a backside ground plane, according to an embodiment of the present invention. The RF integrated circuit 600 may be similar to the RF integrated circuit 400 illustrated in FIG. 4, and may include a polycrystalline core 610 with a polycrystalline ceramic material, such as polycrystalline aluminum nitride (AlN). In some embodiments, the polycrystalline core 610 may be thinned to have a thickness of less than about 100 µm, less than about 50 µm, less than about 25 µm, or less. An interlayer structure 620 similar to the interlayer structure 220, 320, or 420 may be formed on the polycrystalline core 610. As discussed with reference to FIG. 1, one or more layers (e.g., the first adhesion layer, the conductive layer, the second adhesion layer, and the barrier layer) in the interlayer structure 620 may encapsulate the polycrystalline core 610.

The RF integrated circuit 600 may also include one or more epitaxial layers 630, such as one or more GaN layers, and a two-dimensional electron gas (2DEG) inducing layer 640. The RF integrated circuit 600 may also include one or more transistors formed on the 2DEG inducing layer 640. The transistors may include a FET that includes a source 650, a gate 660, and a drain 670. The drain 670 may be connected to the 2DEG inducing layer 640. The gate 660 may be a multiple field-plate gate that is isolated from the 2DEG inducing layer 640 by a gate dielectric 680. The transistors may be encapsulated by an interlayer dielectric 690. A plurality of holes may be etched through the 2DEG inducing layer 640 and the epitaxial layers 630 down to the interlayer structure 620, and may be filled with a conductive material, such as a metal, to form vias 652 connected to the source 650.

In the RF integrated circuit 600, the polycrystalline core 610 may include a plurality of indentations 612 on a (bottom) surface of the polycrystalline core 610 opposite to the first adhesion layer. The thickness of the ceramic core 610 in locations corresponding to the plurality of indentations 612 may be reduced to, for example, to less than 10 µm, due to the indentations 612. In some embodiments, the indentations 612 may be pre-formed in the polycrystalline core 610 during pressing. In some embodiments, the indentations 612 may be formed in the polycrystalline core 610 through wet or dry etching. A through hole 614 may be etched in the polycrystalline core 610 and/or the interlayer structure 620 in locations corresponding to the plurality of indentations 612. Because the thickness of polycrystalline core 610 in locations corresponding to the plurality of indentations 612 is reduced due to the indentations 612, the through hole 614 may be relatively easy to etch. The plurality of indentations 612 in the RF integrated circuit 600 may have a horizontal dimension much larger than the horizontal dimension of the FET. For example, the plurality of indentations 612 in the RF integrated circuit 600 may have a size larger than the width of the FET. As such, the through hole 614 etched in the polycrystalline core 610 and/or the interlayer structure 620 in locations corresponding to the plurality of indentations 612 may be large, such as larger than the area of the FET.

The RF integrated circuit 600 may include a backside metal layer 616 formed on the (bottom) surface of the polycrystalline core 610 opposite to the first adhesion layer and filling the plurality of indentations 612 and the through holes 614 etched in the polycrystalline core 610 and/or the interlayer structure 620 at the locations corresponding to the plurality of indentations 612 to form backside vias 612, such that the source 650 may be in contact with the backside metal layer 616 through the vias 652 and the backside vias 612. Because the area of backside vias 612 may be larger than the area of the FET, the backside of the area under the FET may be filled with the backside metal with no polycrystalline core remaining. The backside metal layer 616 may be grounded. As such, the source 650 may have an even lower inductance to a ground plane than the source 450 of the RF integrated circuit 400 illustrated in FIG. 4, and the RF integrated circuit 600 may operate at even higher frequencies than the RF integrated circuit 400. Furthermore, as in the RF integrated circuit 400, air-bridges may not be needed in RF integrated circuit 600.

Figure 7:
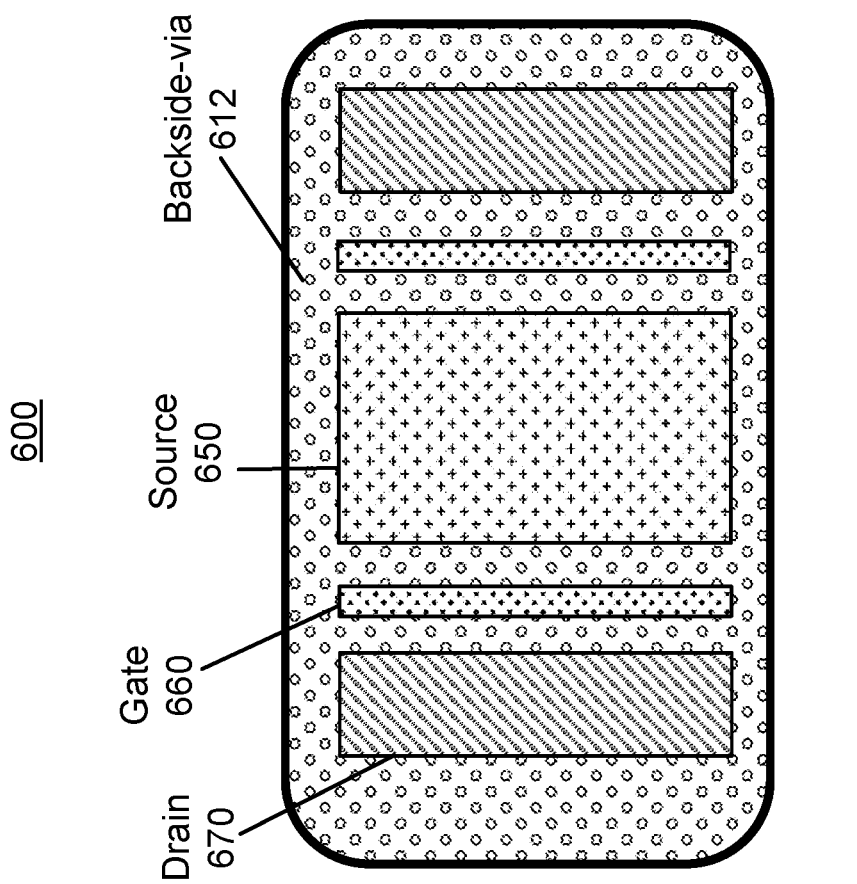
FIG. 7 is a plan view of the RF integrated circuit shown in FIG. 6 according to some embodiments of the present invention.

FIG. 7 is a plan view of the RF integrated circuit 600 including the coplanar waveguide formed on the RF substrate 615 with the backside ground plane shown in FIG. 6. FIG. 7 shows that the backside vias 612 may be formed underneath the whole area of the FET.

Figure 8:
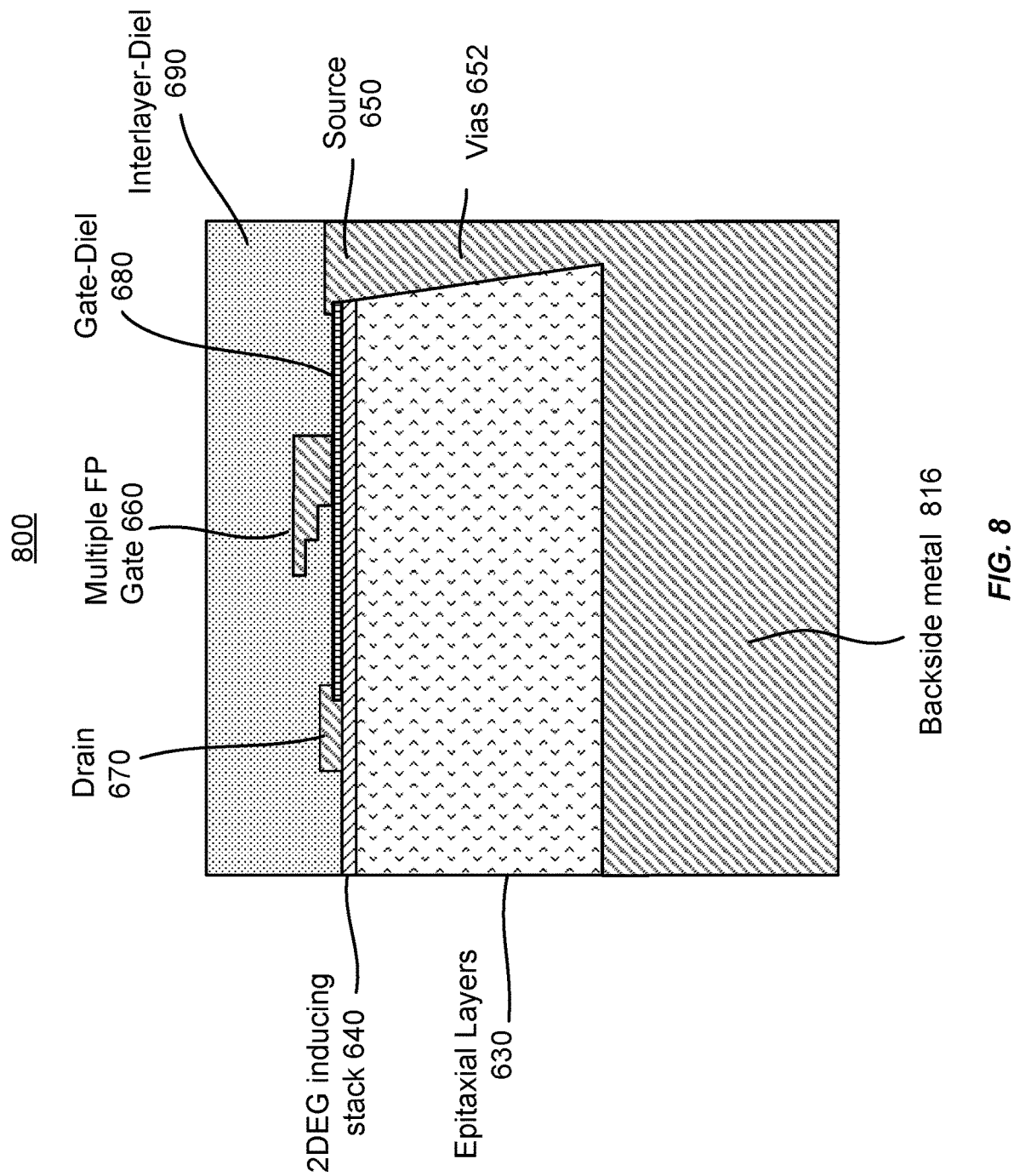
FIG. 8 is a cross-sectional view of an RF integrated circuit according to a further embodiment of the present invention.

FIG. 8 is a cross-sectional view of an RF integrated circuit 800 including a coplanar waveguide formed on an RF substrate with a backside metal layer 816 after the RF substrate is removed, according to an embodiment of the present invention. Similar to the RF integrated circuit 600 illustrated in FIG. 6, the backside metal layer 816 may be connected to the source 650 through one or more vias 652, and thus may serve as a ground plate. As shown in FIG. 8, in some embodiments, the RF substrate may be completely removed from the RF integrated circuit 800, which may further reduce the thermal resistance of the RF integrated circuit 800 and may also be beneficial for packaging (e.g., improving backside solder uniformity). The polycrystalline core 610 may be removed in the RF integrated circuit 800 with epitaxial layers of various thicknesses. In an RF integrated circuit 800 with a thick epitaxial layer 630, the backside metal layer 816 and the epitaxial layer 630 may form a part of a grounded coplanar waveguide. In an RF integrated circuit 800 with a thick epitaxial layer 630 and with the polycrystalline core 610 removed, thermal resistance from the substrate and the interlayers can be eliminated and the backside metal layer 816 can provide a very low-inductance path to ground.

Figure 9:
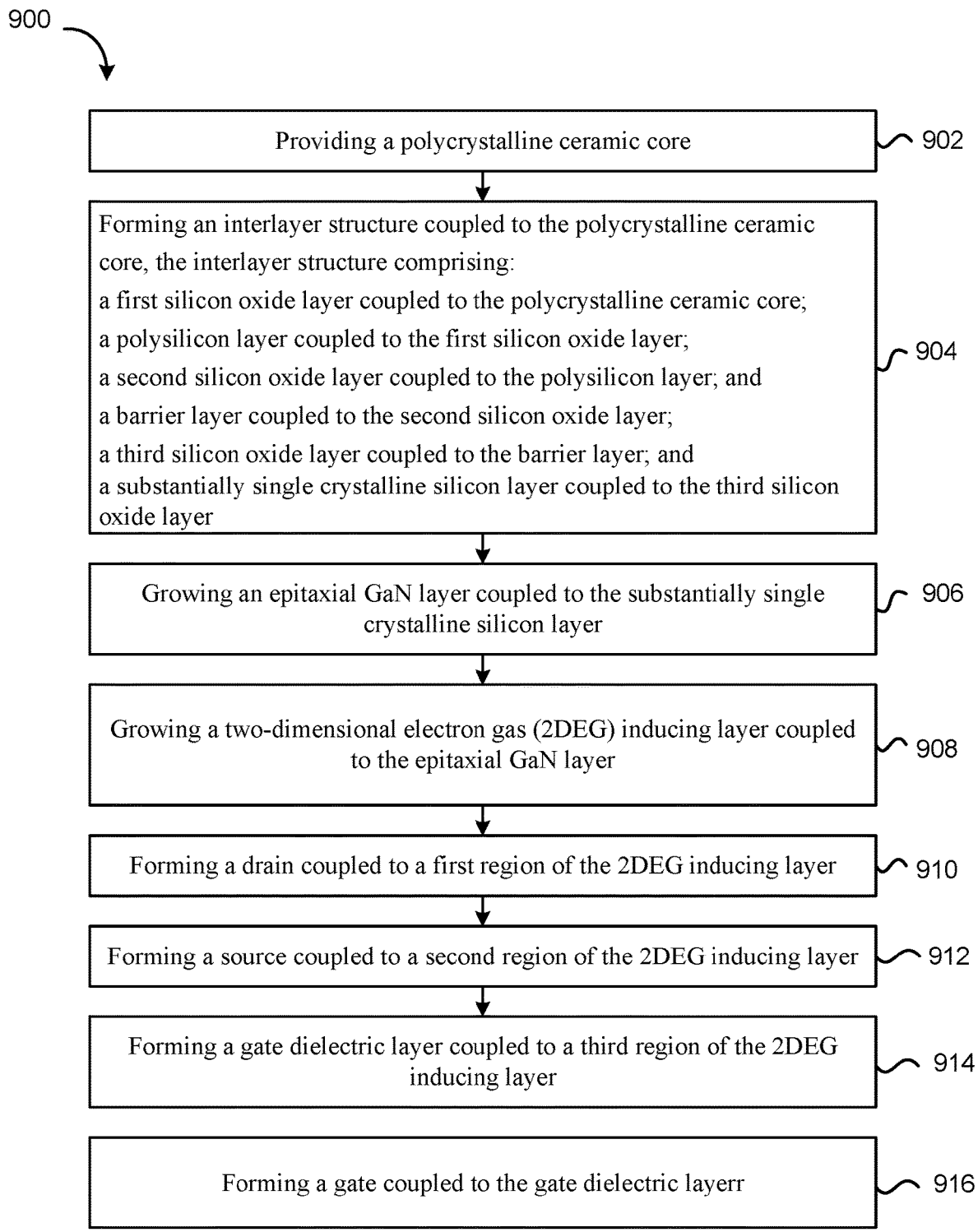
FIG. 9 is a simplified flowchart illustrating a method of forming a RF integrated circuit according to some embodiments of the present invention.

FIG. 9 is a simplified flowchart illustrating a method 900 of forming a RF integrated circuit according to some embodiments of the present invention. The method 900 may include providing a polycrystalline ceramic core (902), and forming an interlayer structure coupled to the polycrystalline ceramic core (904). The interlayer structure may include a first silicon oxide layer coupled to the polycrystalline ceramic core, a polysilicon layer coupled to the first silicon oxide layer, a second silicon oxide layer coupled to the polysilicon layer, a barrier layer coupled to the second silicon oxide layer, a third silicon oxide layer coupled to the barrier layer, and a substantially single crystalline silicon layer coupled to the third silicon oxide layer.

The method 900 may further include growing an epitaxial GaN layer coupled to the substantially single crystalline silicon layer (906), and growing a two-dimensional electron gas (2DEG) inducing layer coupled to the epitaxial GaN layer (908). The method 900 may further include forming a drain coupled to a first region of the 2DEG inducing layer (910), forming a source coupled to a second region of the 2DEG inducing layer (912), forming a gate dielectric layer coupled to a third region of the 2DEG inducing layer (914), and forming a gate coupled to the gate dielectric layer (916).

It should be appreciated that the specific steps illustrated in FIG. 9 provide a particular method of fabricating an engineered substrate according to an embodiment of the present invention. Other sequences of steps may also be performed according to alternative embodiments. For example, alternative embodiments of the present invention may perform the steps outlined above in a different order. Moreover, the individual steps illustrated in FIG. 9 may include multiple sub-steps that may be performed in various sequences as appropriate to the individual step. Furthermore, additional steps may be added or removed depending on the particular applications. One of ordinary skill in the art would recognize many variations, modifications, and alternatives.

Although some embodiments have been discussed in terms of a layer, the term layer should be understood such that a layer can include a number of sub-layers that are built up to form the layer of interest. Thus, the term layer is not intended to denote a single layer consisting of a single material, but to encompass one or more materials layered in a composite manner to form the desired structure. One of ordinary skill in the art would recognize many variations, modifications, and alternatives.

It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A substrate for radio frequency (RF) devices comprising:
    a polycrystalline ceramic core; and
    an interlayer structure comprising:
        a first adhesion layer coupled to the polycrystalline ceramic core;
        a conductive layer coupled to the first adhesion layer;
        a second adhesion layer coupled to the conductive layer;
        a barrier layer coupled to the second adhesion layer;
        a bonding layer coupled to the barrier layer; and
        a substantially single crystalline layer coupled to the bonding layer.

2. The substrate of claim 1 wherein the polycrystalline ceramic core comprises aluminum nitride.

3. The substrate of claim 2 wherein:
    the first adhesion layer comprises silicon oxide;
    the conductive layer comprises polysilicon;
    the second adhesion layer comprises silicon oxide; and
    the bonding layer comprises silicon oxide.

4. The substrate of claim 3 wherein the substantially single crystalline layer comprises silicon.

5. The substrate of claim 4 further comprising:
    an epitaxial gallium nitride (GaN) layer coupled to the substantially single crystalline layer; and
    a coplanar waveguide formed on the epitaxial GaN layer.

6. The substrate of claim 5 further comprising:
    a two-dimensional electron gas (2DEG) inducing layer coupled to the epitaxial GaN layer; and
    a field effect transistor (FET) comprising:
        a drain coupled to a first region of the 2DEG inducing layer;

a source coupled to a second region of the 2DEG inducing layer;
a gate dielectric layer coupled to a third region of the 2DEG inducing layer; and
a gate coupled to the gate dielectric layer.

7. The substrate of claim 6 wherein the barrier layer comprises:
a first silicon nitride layer coupled to the second adhesion layer;
a metal layer coupled to the first silicon nitride layer; and
a second silicon nitride layer coupled to the metal layer.

8. The substrate of claim 7 further comprising a first via through the epitaxial GaN layer and the 2DEG inducing layer, the first via coupling the source to the metal layer, wherein the metal layer is connected to ground.

9. The substrate of claim 8 wherein the polycrystalline ceramic core comprises an indentation on a surface of the polycrystalline ceramic core opposite to the first adhesion layer, the substrate further comprising:
a second via through the polycrystalline ceramic core in a location corresponding to the indentation; and
a backside metal layer coupled to the surface of the polycrystalline ceramic core and filling the second via, wherein the second via connects the source of the FET to the backside metal layer, and wherein the backside metal layer is connected to ground.

10. The substrate of claim 9 wherein a thickness of the polycrystalline ceramic core in the location corresponding to the indentation is less than 10 µm.

11. The substrate of claim 9 wherein a width of the indentation is greater than a width of the FET.

12. A radio frequency (RF) device comprising:
a polycrystalline ceramic core;
an interlayer structure comprising:
a first adhesion layer coupled to the polycrystalline ceramic core;
a conductive layer coupled to the first adhesion layer;
a second adhesion layer coupled to the conductive layer;
a barrier layer coupled to the second adhesion layer;
a bonding layer coupled to the barrier layer; and
a substantially single crystalline layer coupled to the bonding layer;
an epitaxial III-V layer coupled to the substantially single crystalline layer;
a two-dimensional electron gas (2DEG) inducing layer coupled to the epitaxial III-V layer; and
a field effect transistors (FET) comprising:
a drain coupled to a first region of the 2DEG inducing layer;
a source coupled to a second region of the 2DEG inducing layer;
a gate dielectric layer coupled to a third region of the 2DEG inducing layer; and
a gate coupled to the gate dielectric layer.

13. The RF device of claim 12 wherein:
the first adhesion layer comprises silicon oxide;
the conductive layer comprises polysilicon;
the second adhesion layer comprises silicon oxide; and
the bonding layer comprises silicon oxide.

14. The RF device of claim 13 wherein the barrier layer comprises:
a first silicon nitride layer coupled to the second adhesion layer;
a metal layer coupled to the first silicon nitride layer; and
a second silicon nitride layer coupled to the metal layer.

15. The RF device of claim 14 further comprising:
a first via through the epitaxial III-V layer and the 2DEG inducing layer, the first via coupling the source to the metal layer of the barrier layer, wherein the metal layer is connected to ground.

16. The RF device of claim 15 wherein the substantially single crystalline layer comprises silicon.

17. The RF device of claim 16 wherein the epitaxial III-V layer comprises epitaxial gallium nitride (GaN).

18. The RF device of claim 12 further comprising a waveguide coupled to the epitaxial III-V layer.

19. The RF device of claim 12 wherein the polycrystalline ceramic core comprises an indentation on a surface of the polycrystalline ceramic core opposite to the first adhesion layer, the RF device further comprising:
a second via through the polycrystalline ceramic core in a location corresponding to the indentation; and
a backside metal layer coupled to the surface of the polycrystalline ceramic core and filling the second via, wherein the second via connects the source of the FET to the backside metal layer, and wherein the backside metal layer is connected to ground.

* * * * *